(12) United States Patent
Bera et al.

(10) Patent No.: US 11,315,763 B2
(45) Date of Patent: *Apr. 26, 2022

(54) SHAPED ELECTRODES FOR IMPROVED PLASMA EXPOSURE FROM VERTICAL PLASMA SOURCE

(71) Applicant: Applied Materials, Inc., Santa Clara, CA (US)

(72) Inventors: Kallol Bera, Fremont, CA (US); Dmitry A. Dzilno, Sunnyvale, CA (US); Anantha K. Subramani, San Jose, CA (US); John C. Forster, Mt. View, CA (US); Tsutomu Tanaka, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/009,167

(22) Filed: Sep. 1, 2020

(65) Prior Publication Data

US 2020/0395194 A1    Dec. 17, 2020

Related U.S. Application Data

(63) Continuation of application No. 16/220,825, filed on Dec. 14, 2018, now Pat. No. 10,763,085.

(Continued)

(51) Int. Cl.
  *H01J 37/32* (2006.01)
(52) U.S. Cl.
  CPC .... *H01J 37/32541* (2013.01); *H01J 37/3255* (2013.01); *H01J 37/32091* (2013.01);
(Continued)

(58) Field of Classification Search
  CPC ........... H01J 37/32541; H01J 37/32779; H01J 37/32091; H01J 37/3255; H01J 37/32577;
  (Continued)

(56) References Cited

U.S. PATENT DOCUMENTS 10,763,085 B2 * 9/2020 Bera ................... H01J 37/3255
2007/0283888 A1  12/2007 Schmitt
(Continued)

FOREIGN PATENT DOCUMENTS

CN    101420816 A    4/2009
CN    105102675 A    11/2015
(Continued)

OTHER PUBLICATIONS

PCT International Search Report and Written Opinion in PCT/US2018/065612 dated Apr. 11, 2019, 9 pages.
(Continued)

*Primary Examiner* — Renan Luque
(74) *Attorney, Agent, or Firm* — Servilla Whitney LLC

(57) ABSTRACT

Plasma source assemblies comprising an RF hot electrode having a body and at least one return electrode spaced from the RF hot electrode to provide a gap in which a plasma can be formed. An RF feed is connected to the RF hot electrode at a distance from the inner peripheral end of the RF hot electrode that is less than or equal to about 25% of the length of the RF hot electrode. The RF hot electrode can include a leg and optional triangular portion near the leg that extends at an angle to the body of the RF hot electrode. A cladding material on one or more of the RF hot electrode and the return electrode can be variably spaced or have variable properties along the length of the plasma gap.

17 Claims, 13 Drawing Sheets

Related U.S. Application Data

(60) Provisional application No. 62/599,679, filed on Dec. 15, 2017.

(52) U.S. Cl.
CPC .. *H01J 37/32577* (2013.01); *H01J 37/32779* (2013.01); *H01J 37/32816* (2013.01)

(58) Field of Classification Search
CPC ........... H01J 37/32816; H01J 37/32532; H01J 37/32082; C23C 16/50
See application file for complete search history.

(56) References Cited

U.S. PATENT DOCUMENTS

| | | | |
|---|---|---|---|
| 2011/0115380 A1* | 5/2011 | Ebe | H05H 1/46 315/111.41 |
| 2012/0152171 A1 | 6/2012 | Lee et al. | |
| 2013/0206067 A1 | 8/2013 | Kato | |
| 2013/0220975 A1 | 8/2013 | Dhindsa | |
| 2015/0200076 A1 | 7/2015 | Koo et al. | |
| 2015/0026792 A1 | 9/2015 | Bera | |
| 2015/0262792 A1* | 9/2015 | Bera | H01J 37/32577 315/111.21 |
| 2016/0220953 A1 | 8/2016 | Wamura | |
| 2016/0348292 A1 | 12/2016 | Cornelius et al. | |
| 2017/0148626 A1 | 5/2017 | Subramani et al. | |
| 2017/0213701 A1 | 7/2017 | Subramani | |
| 2017/0213702 A1 | 7/2017 | Hammond, IV | |

FOREIGN PATENT DOCUMENTS

| | | | |
|---|---|---|---|
| CN | 105474362 A | | 4/2016 |
| JP | 2003338399 A | * | 11/2003 |
| JP | 2003338399 A | | 11/2003 |
| JP | 2013254723 A | | 12/2013 |
| KR | 20110054726 A | | 5/2011 |
| TW | 200920192 A | | 5/2009 |
| TW | 201515528 A | | 4/2015 |
| TW | 201714493 A | | 4/2017 |

OTHER PUBLICATIONS

Non-Final Office Action in U.S. Appl. No. 17/150,702 dated Oct. 4, 2021, 32 pages.

* cited by examiner

US 11,315,763 B2

SHAPED ELECTRODES FOR IMPROVED PLASMA EXPOSURE FROM VERTICAL PLASMA SOURCE

CROSS-REFERENCE TO RELATED APPLICATIONS

This application is a continuation application of U.S. patent application Ser. No. 16/220,825, filed Dec. 14, 2018, which claims priority to U.S. Provisional Application No. 62/599,679, filed Dec. 15, 2017, the entire disclosures of which are hereby incorporated by reference herein.

FIELD

Embodiments of the disclosure generally relate to an apparatus for processing substrates. More particularly, embodiments of the disclosure relate to modular plasma sources for use with processing chambers like batch processors.

BACKGROUND

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Some ALD systems, especially spatial ALD systems with rotating substrate platens, benefit from a modular plasma source, i.e., a source that can be easily inserted into the system. The plasma source consists of a volume where plasma is generated, and a way to expose a workpiece to a flux of charged particles and active chemical radical species.

Thermal ALD and CVD processes frequently incorporate treatments for film quality enhancements. These treatments typically comprise energetic or reactive species. Plasma sources are a primary source for such species. Some concerns of plasma sources include energetic bombardment through ions and contamination of materials from the plasma source due to sputtering.

For linear radial plasma sources in any system with a rotating susceptor (also called a platen), the plasma exposure (treatment) is larger at the wafer inner diameter compared to the outer diameter by a factor of about 2.7. Therefore, for uniform plasma exposure, the plasma should be stronger at the outer diameter than the inner diameter. Therefore, there is a need in the art for plasma sources that achieve uniform plasma exposure in rotating platen processing systems.

SUMMARY

One or more embodiments of the disclosure are directed to plasma source assemblies comprising a housing with an RF hot electrode, a return electrode and an RF feed. The housing has an inner peripheral edge, an outer peripheral edge and a front face. The housing includes a gas inlet to form a flow path from the gas inlet to allow a flow of gas to pass through the housing and out an opening in the front face. The RF hot electrode is within the housing and has an elongate body with an inner peripheral end near the inner peripheral edge of the housing and an outer peripheral end near the outer peripheral edge of the housing and defining a length of the RF hot electrode. The RF hot electrode includes a leg extending at an angle to the elongate body. The return electrode has an elongate body extending between the inner peripheral edge and the outer peripheral edge of the housing. The return electrode is spaced from the RF hot electrode to provide a gap in which a plasma can form. The RF feed is connected to the RF hot electrode at a distance from the inner peripheral end of the RF hot electrode that is less or equal to about 25% of the length of the RF hot electrode.

BRIEF DESCRIPTION OF THE DRAWINGS

So that the manner in which the above recited features of embodiments of the disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
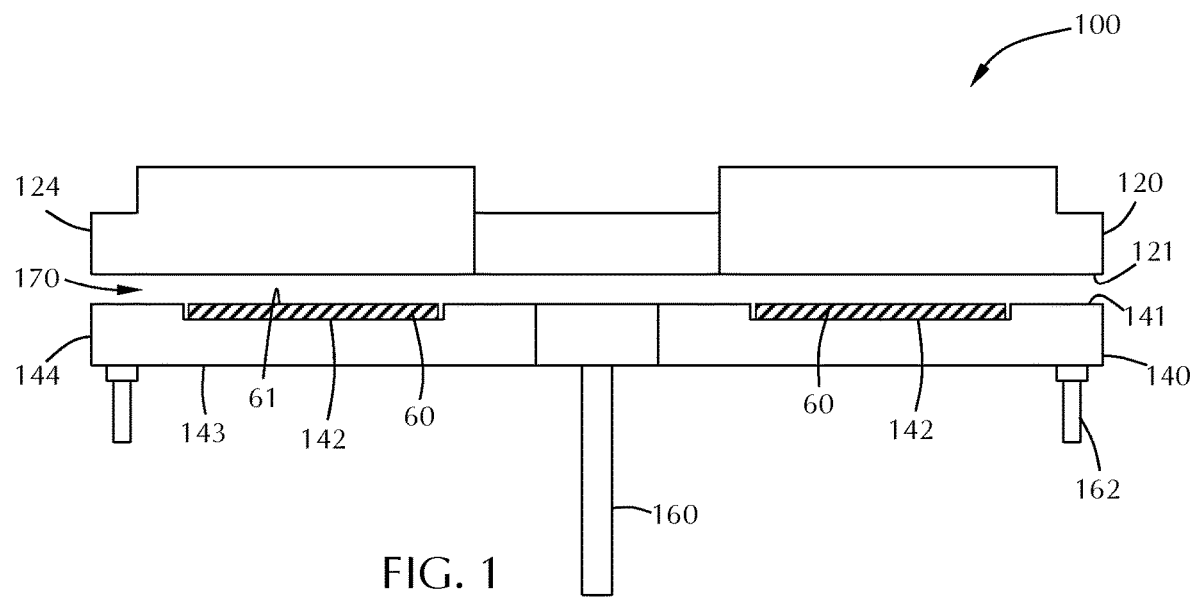
FIG. 1 shows a schematic cross-sectional view of a substrate processing system in accordance with one or more embodiments of the disclosure.

Embodiments of the disclosure provide a substrate processing system for continuous substrate deposition to maximize throughput and improve processing efficiency. The substrate processing system can also be used for pre-deposition and post-deposition plasma treatments.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

As used in this specification and the appended claims, the term "reduced pressure" means a pressure less than about 100 Torr, or less than about 75 Torr, or less than about 50 Torr, or less than about 25 Torr. For example, "medium pressure" defined as in the range of about 1 Torr to about 25 Torr is reduced pressure.

Rotating platen chambers are being considered for many applications. In such a chamber, one or more wafers are placed on a rotating holder ("platen"). As the platen rotates, the wafers move between various processing areas. For example, in ALD, the processing areas would expose the wafer to precursors and reactants. In addition, plasma exposure may be used as a reactant or to treat the film or the substrate surface for enhanced film growth or to modify film properties. Some embodiments of the disclosure provide for uniform deposition and post-treatment (e.g., densification) of ALD films when using a rotating platen ALD chamber.

Rotating platen ALD chambers can deposit films by traditional time-domain processes where the entire wafer is exposed to a first gas, purged and then exposed to the second gas, or by spatial ALD where portions of the wafer are exposed to the first gas and portions are exposed to the second gas and the movement of the wafer through these gas streams deposits the layer.

As used in this specification and the appended claims, the terms "pie-shaped" and "wedge-shaped" are used interchangeably to describe a body that is a sector of a circle. For example, a wedge-shaped segment may be a fraction of a circle or disc-shaped structure and multiple wedge-shaped segments can be connected to form a circular body. The sector can be defined as a part of a circle enclosed by two radii of a circle and the intersecting arc. The inner edge of the pie-shaped segment can come to a point or can be truncated to a flat edge or rounded. In some embodiments, the sector can be defined as a portion of a ring or annulus.

The path of the substrates can be perpendicular to the gas ports. In some embodiments, each of the gas injector assemblies comprises a plurality of elongate gas ports which extend in a direction substantially perpendicular to the path traversed by a substrate, where a front edge of the gas ports is substantially parallel to the platen. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
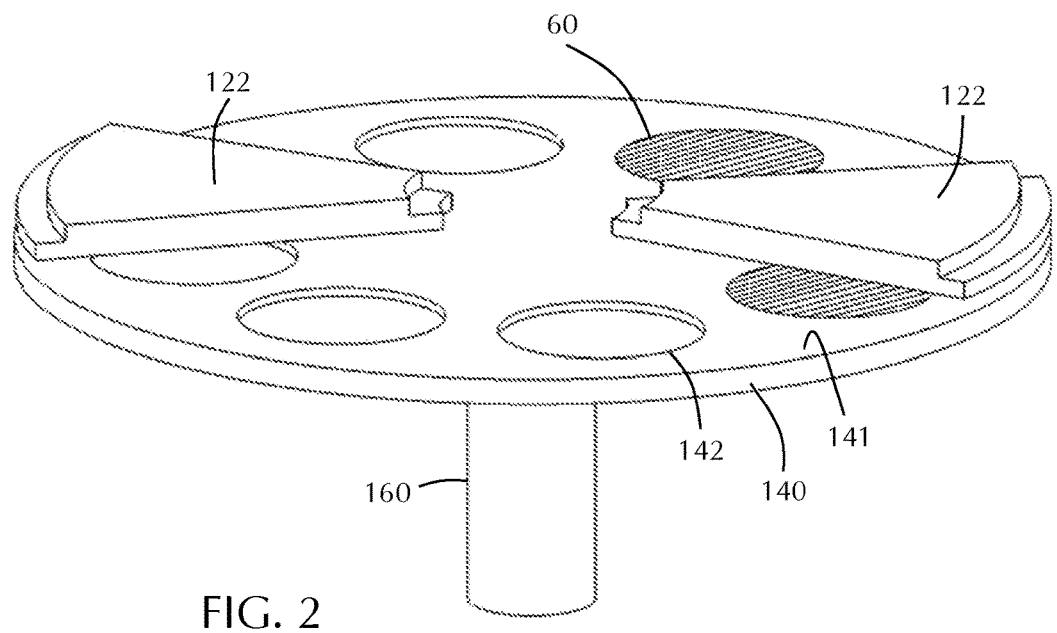
FIG. 2 shows a perspective view of a substrate processing system in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm. The recess 142 of some embodiments supports a wafer so that the inner diameter (ID) of the wafer is located within the range of about 170 mm to about 185 mm from the center (axis of rotation) of the susceptor. In some embodiments, the recess 142 supports a wafer so that the outer diameter (OD) of the wafer is located in the range of about 470 mm to about 485 mm from the center (axis of rotation) of the susceptor.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
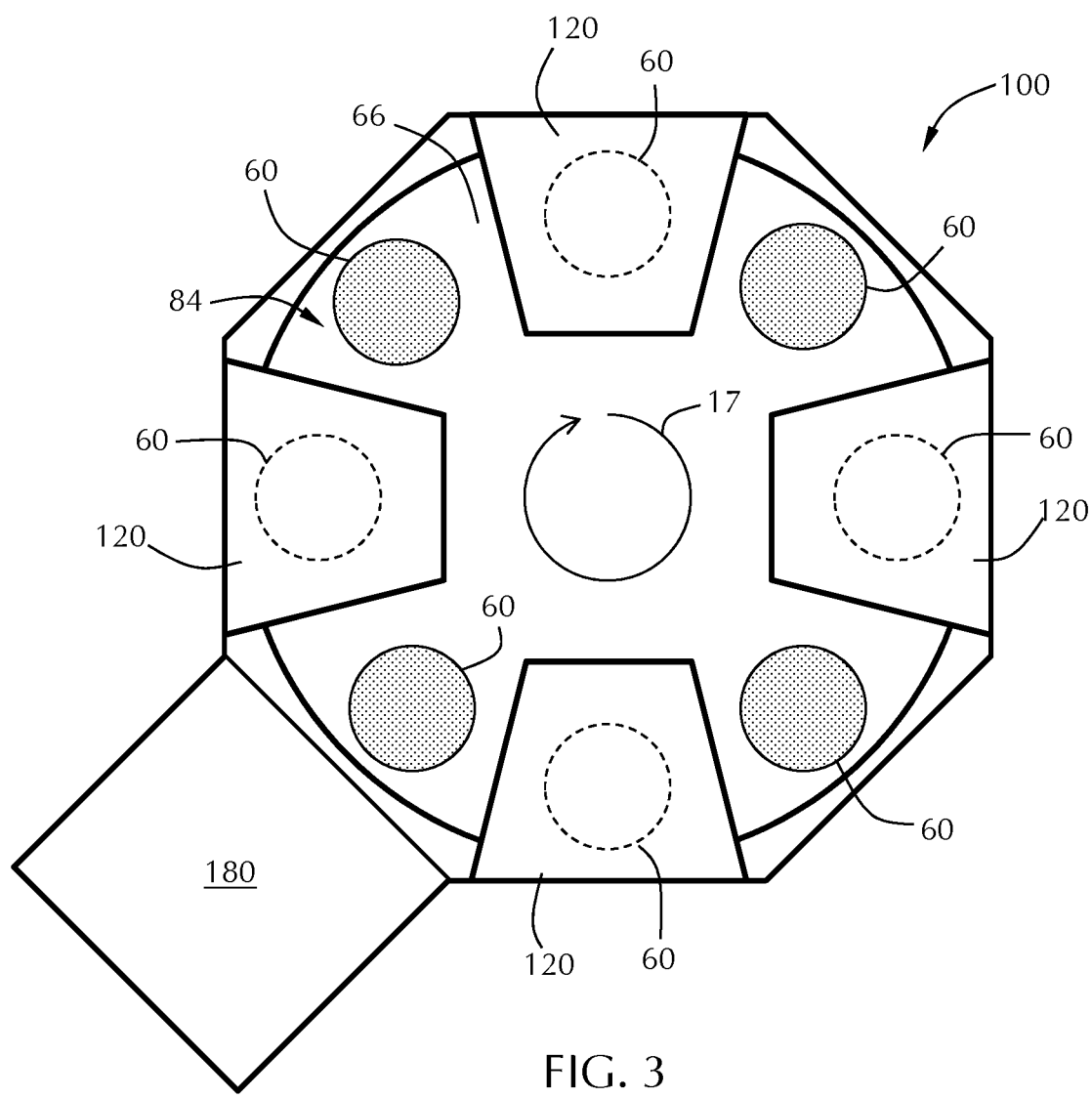
FIG. 3 shows a schematic of a substrate processing system in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
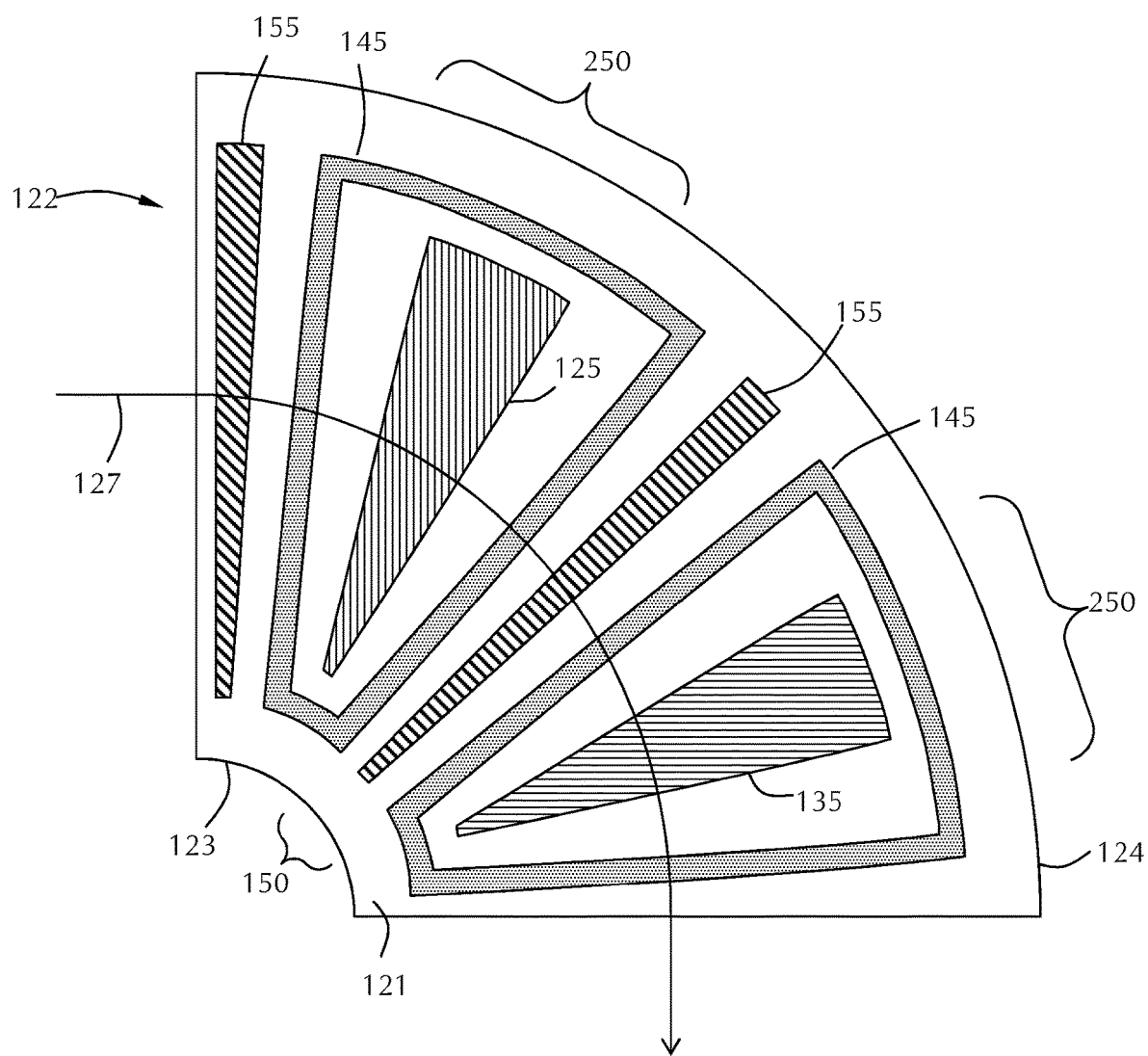
FIG. 4 shows a schematic view of a front of a gas distribution assembly in accordance with one or more embodiment of the disclosure.
Figure 5:
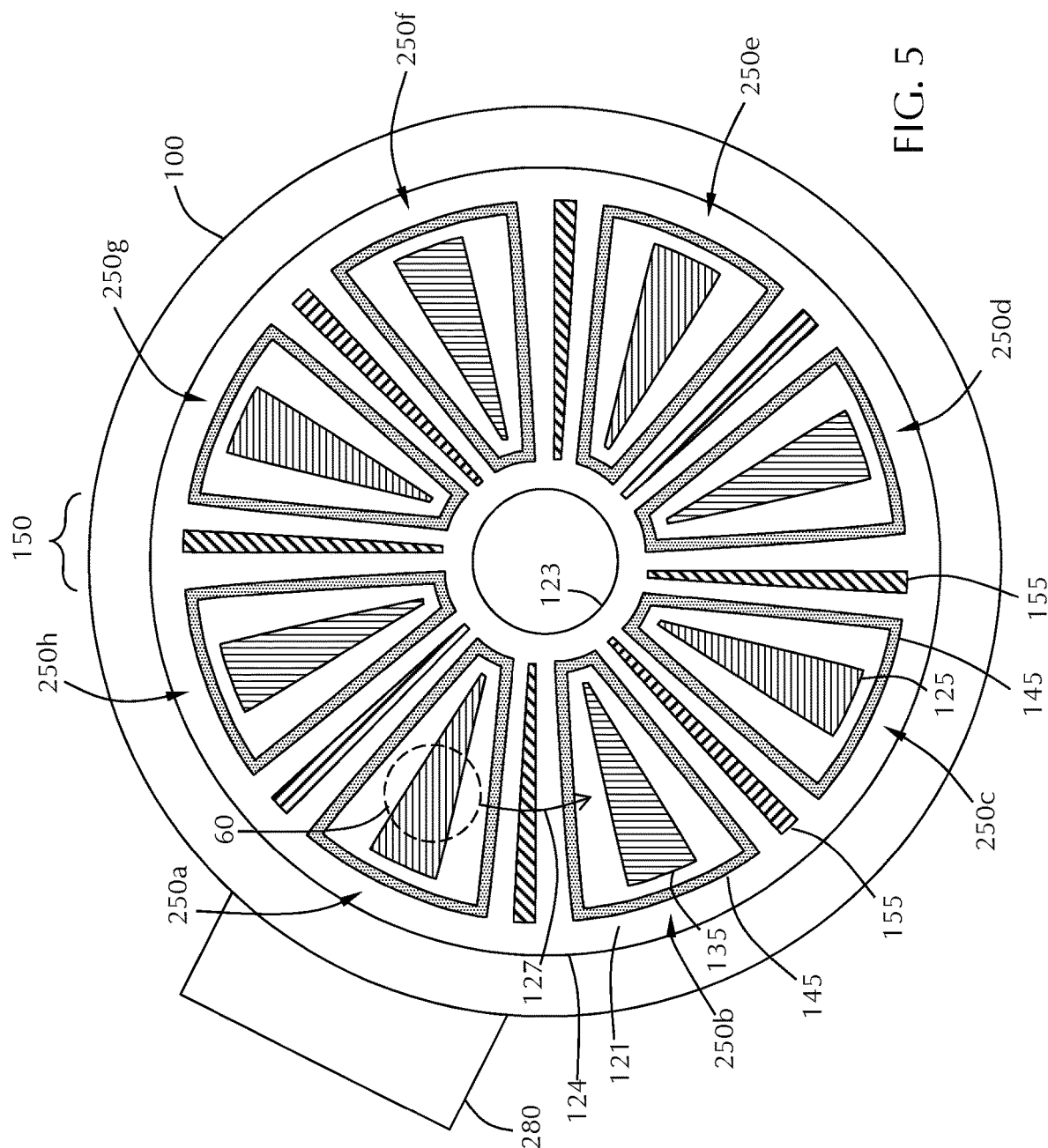
FIG. 5 shows a schematic view of a processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145 and vacuum ports 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150*a*, 150*b*. Rotating the substrate 60 along path 127 will move the substrate counter-clockwise around the processing chamber 100. Thus, the substrate 60 will be exposed to the first processing region 250*a* through the eighth processing region 250*h*, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. For example, if region 250a had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Some embodiments of the disclosure are directed to injector modules. While the injector modules are described with respect to a spatial ALD processing chamber, those skilled in the art will understand that the modules are not limited to spatial ALD chambers and can be applicable to any injector situation where increasing gas flow uniformity is useful.

Some embodiments of the disclosure advantageously provide modular plasma source assemblies, i.e., a source that can be easily inserted into and removed from the processing system. Such a source may have all or most of its hardware operating at the same pressure level as the atomic layer deposition process, typically 1-50 Torr. Some embodiments of the disclosure provide plasma sources with improved ion flux across the wafer surface. In some embodiments, plasma sources include a capacitive source between three plates aligned substantially perpendicular to the wafer surface. In some embodiments, the outer plates are grounded and the inner plate is powered. A plasma can be created between the plates while the gas species flows between the plates toward the wafer surface. The plasma is substantially confined to the source and minimizes sputtered material from the powered plate reaching the wafer surface. Some embodiments of the disclosure advantageously provide a plasma source that minimizes or eliminates contamination of the substrate by material sputtered from the hot electrode. Some embodiments also advantageously provide a soft plasma that does not substantially change of the substrate surface. One or more embodiments provide an apparatus that can generate a plasma without allowing the electrical return path to go through the substrate. Some embodiments of the disclosure provide modular remote plasma sources that can be added to or removed from a gas distribution assembly. The remote plasma source generates a plasma without using the substrate or substrate support as an electrode.

The gap between the RF hot electrode (the powered electrode) and the ground plate (referred to as a return electrode) can be varied. In some embodiments, the gap is in the range of about 3 mm to about 15 mm and may be adjustable. The width of the RF hot electrode can be varied. For example, the plates can be tapered to accelerate ions. In use, the gaseous species flowing in the gap between the RF hot electrode and the return electrode become ionized. The ionized species can then contact the substrate surface. In some embodiments, the plasma formed is a soft plasma that does not substantially change the substrate surface.

Referring to FIGS. 6 through 19B, one or more embodiments of the disclosure are directed to modular capacitively coupled plasma sources 300. As used in this specification and the appended claims, the term "modular" means that plasma source 300 can be attached to or removed from a processing chamber. A modular source can generally be moved, removed or attached by a single person.

Figure 6:
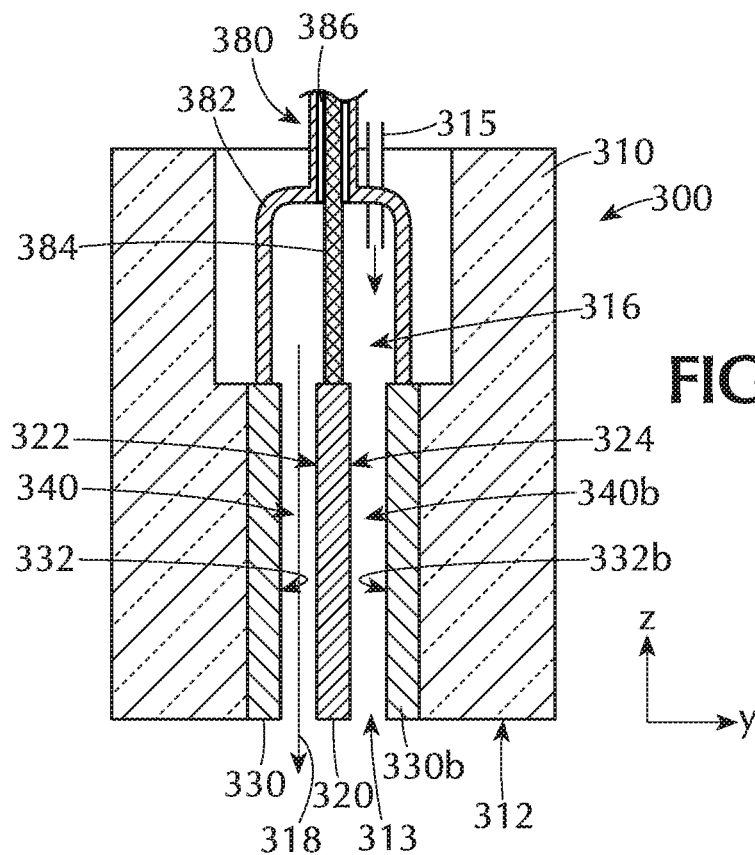
FIG. 6 shows a schematic cross-sectional view of a plasma source assembly in accordance with one or more embodiment of the disclosure.

FIG. 6 shows a cross-section of a plasma source assembly 300 in accordance with one or more embodiment of the disclosure. The plasma source assembly 300 shown in FIG. 6 includes a housing 310 with a gas inlet 315 and a front face 312. The gas inlet 315 allows a flow of gas to move along the flow path 318 through the housing 310 and out an opening 313 in the front face 312. The embodiment shown has a gas inlet 315 illustrated off-center for descriptive purposes, but those skilled in the art will understand that the gas inlet 315 can be centered in the housing 310. Additionally, some embodiments include a plenum 316 to increase the uniformity of the gas flow through the flow path 318. The plenum 316 of some embodiments is at least partially filled with a dielectric, which has a plurality of through holes and/or plenums to allow gas to reach the plasma cavity (gap 340, 340b) uniformly. The through holes and/or plenums have dimensions small enough to prevent plasma breakdown. In some embodiments, the through holes have diameters less than or equal to about 1 mm, 0.95 mm, 0.9 mm, 0.85 mm, 0.8 mm, 0.75 mm, 0.7 mm, 0.65 mm or 0.6 mm.

The plasma source assembly 300 includes an RF hot electrode 320 and at least one return electrode 330. The return electrode 330 is any conductive material that forms a complete circuit with the RF hot electrode 320. Those skilled in the art will understand that the return electrode 330 can provide a pathway for electrons to flow. The term "return" used in this manner means that the electrode is part of the electrical pathway of the plasma components and does not imply a direction for the flow of current or electrons.

Figure 7:
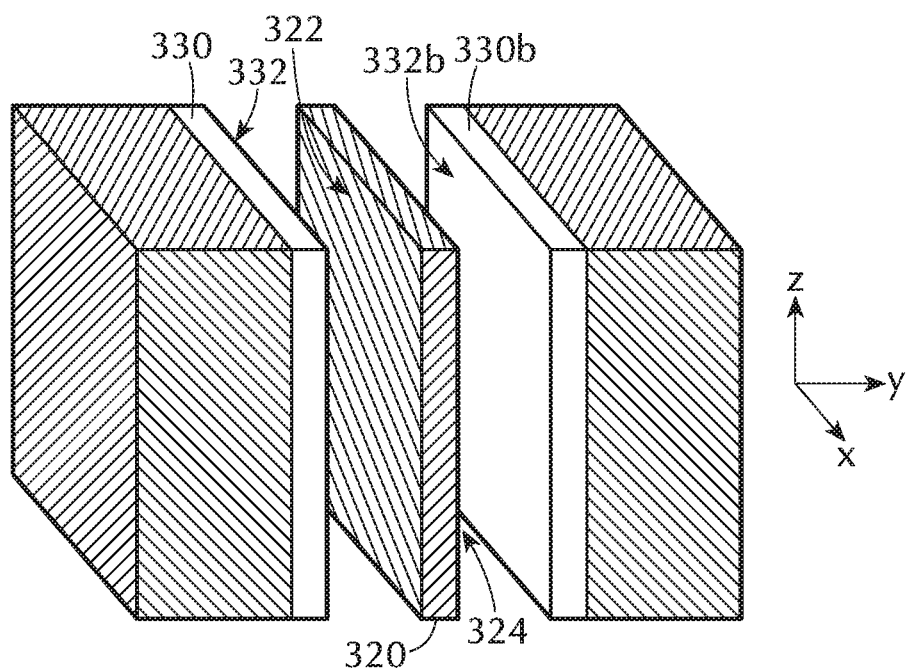
FIG. 7 shows a partial perspective view of a plasma source assembly in accordance with one or more embodiments of the disclosure.
Figure 8:
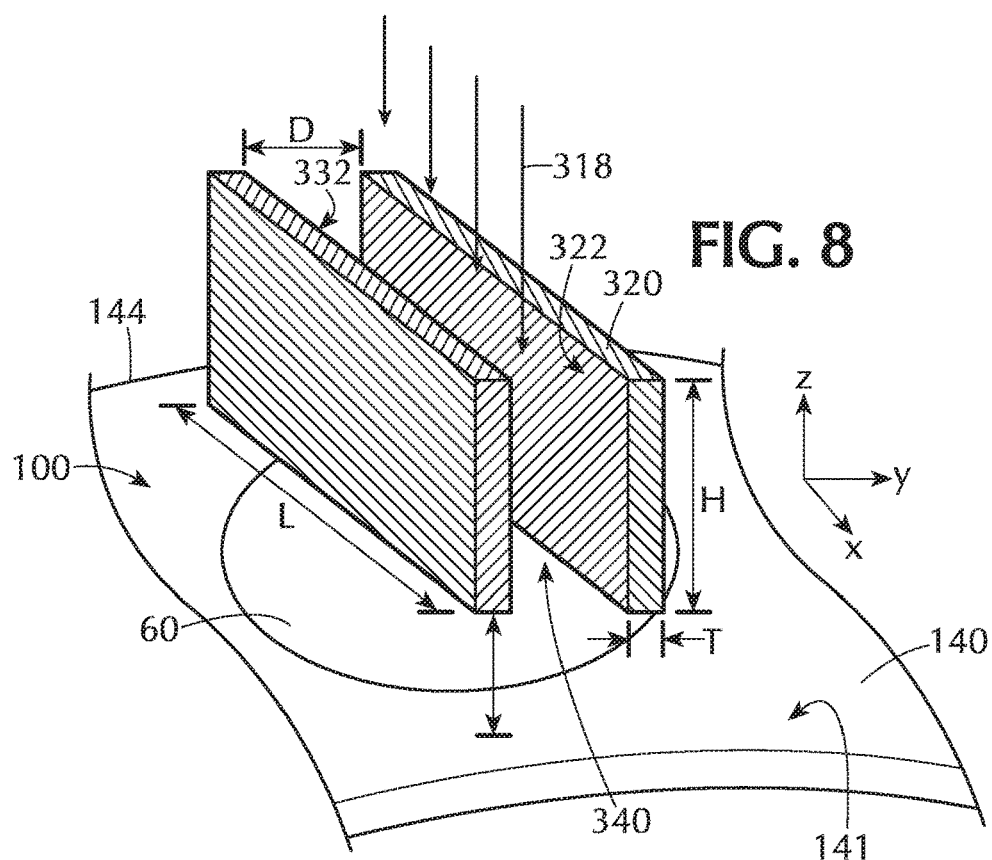
FIG. 8 shows a partial isometric view of a plasma source assembly in accordance with one or more embodiments of the disclosure.

Referring to FIGS. 6 to 8, the RF hot electrode 320 has a first surface 322 and a second surface 324 opposite the first surface 322. FIG. 6 shows a cross-section of a plasma source assembly 300 while FIGS. 7 and 8 show partial perspective views of the electrodes. As used in this regard, the first surface 322 and second surface 324 are on opposite sides of the thickness T of the RF hot electrode 320. The RF hot electrode 320 is a generally shaped as a rectangular prism with a height H, thickness T and length L. The RF hot electrode 320 has a first surface 322 oriented substantially parallel to the flow path 318. As used in this regard, the term "substantially parallel" means that the surface is within ±10° of parallel (defined as 0°).

The return electrode 330 is similarly shaped to the RF hot electrode 320. The return electrode has a first surface 332 that is oriented substantially parallel to the flow path 318. The first surface 332 of the return electrode 330 is spaced from the first surface 322 of the RF hot electrode 320 to form a gap 340.

The return electrode 330,330b can be any suitable material including, but not limited to, aluminum, stainless steel and copper. The return electrode 330, 330b can have any suitable electrical characteristics. In some embodiments, the return electrode 330, 330b is a ground electrode. A ground electrode is any conductive material in electrical contact with electrical ground.

In some embodiments, the return electrode 330, 330b is a powered electrode different from the RF hot electrode 320. As used in this manner, "different from the RF hot electrode" means that the electrical properties or potential are different from the RF hot electrode. For example, the driving power of the generated plasma may be tuned in a push-pull manner from a single source using a phase shifter to minimize interaction with the wafer. In embodiments of this sort, the RF hot electrode 320 may be, for example, 180° out of phase with the return electrode 330.

As shown in FIG. 7, some embodiments of the plasma source assembly further comprise a second return electrode 330b. The second return electrode 330b has a first surface 332b which is oriented substantially parallel to the flow path 318. The first surface 332b of the second return electrode 330b is spaced from a second surface 324 of the RF hot electrode 320 to form a gap 340b. The gap 340 and gap 340b can have the same or different dimensions. In some embodiments, the gap 340, 340b between the RF hot electrode 320 and the return electrode 330, 330b is in the range of about 4 mm to about 15 mm, or in the range of about 5 mm to about 14 mm, or in the range of about 7 mm to about 13 mm, or in the range of about 9 mm to about 12 mm, or about 11 mm.

The thickness T of the RF hot electrode 320 can be any suitable thickness depending on, for example, the electrode material. In some embodiments, the RF hot electrode has a thickness in the range of about 3 mm to about 11 mm, or in the range of about 4 mm to about 10 mm, or in the range of about 6 mm to about 9 mm or about 8 mm.

The height H of the RF hot electrode 320 can be varied. In some embodiments, the height H of the RF hot electrode 320 is in the range of about 8 mm to about 40 mm, or in the range of about 9 mm to about 35 mm, or in the range of about 10 mm to about 30 mm, or in the range of about 11 mm to about 25 mm, or in the range of about 12 mm to about 20 mm, or in the range of about 13 mm to about 15 mm or about 14 mm.

Figure 9:
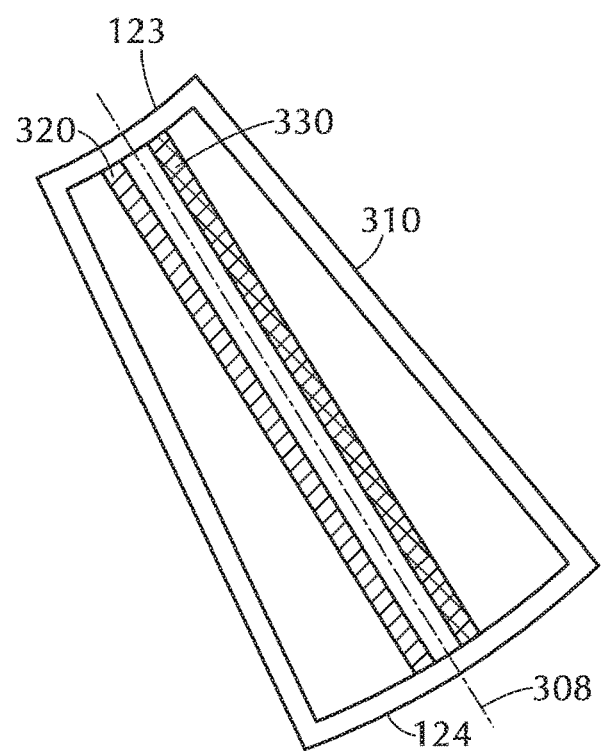
FIG. 9 shows a schematic bottom view of a plasma source assembly in accordance with one or more embodiments of the disclosure.

In some embodiments, the housing 310 of the plasma source assembly 300 is wedge-shaped. FIG. 9 shows an embodiment incorporating a wedge-shaped housing 310. As shown, the RF hot electrode 320 and the return electrode 330 extend along a major axis 308 of the housing 310. The major axis 308, as used in this manner, refers to the axis that extends through the middle of the arc forming the inner peripheral edge 123 and the middle of the arc forming the outer peripheral edge 124.

The spacing between the RF hot electrodes 320 and the return electrodes 330 can be substantially the same along the major axis 308 the plasma source assembly or can vary. For example, in some embodiments, the RF hot electrode and the return electrode are spaced further apart at the outer peripheral edge 124 of the wedge-shaped housing 310 than near the inner peripheral edge 123.

Figure 10:
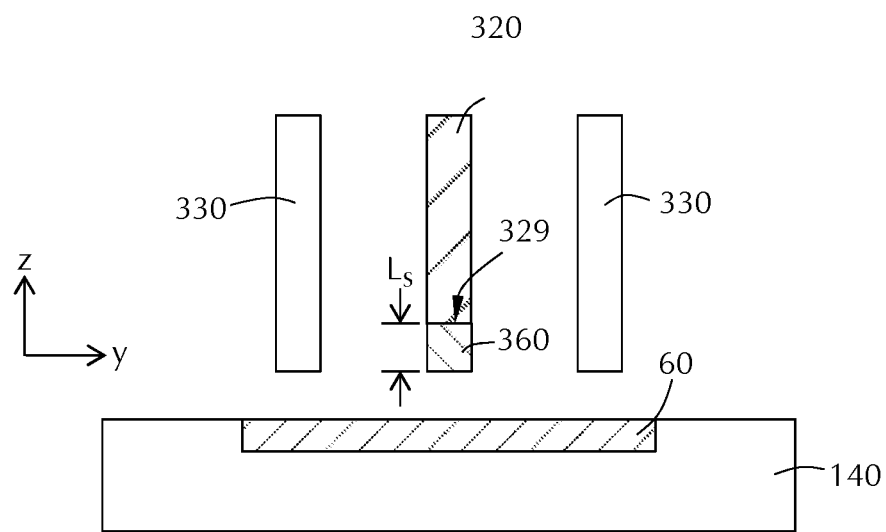
FIG. 10 shows a schematic side view of a plasma source assembly in accordance with one or more embodiments of the disclosure.

Some embodiments include a cladding 360 adjacent a lower edge 329 of the RF hot electrode 320. Referring to FIG. 10, the RF hot electrode 320 is illustrated between two return electrodes 330. A cladding 360 separates the lower edge 329 of the RF hot electrode 320 from the substrate 60 and susceptor assembly 140. The presence of the cladding 360, in some embodiments, helps prevent or minimize sputtering of the RF hot electrode 320 from contaminating the substrate 60. The cladding 360 can be made of any suitable material including, but not limited to, dielectrics (e.g., ceramic materials). The size of the cladding 360 can be adjusted to move the lower edge 329 of the RF hot electrode 320 from the vicinity of the substrate 60. In some embodiments, the cladding 360 has a length Ls in the range of about 10 mm to about 25 mm, or in the range of about 13 mm to about 20 mm or about 17 mm.

Figure 11:
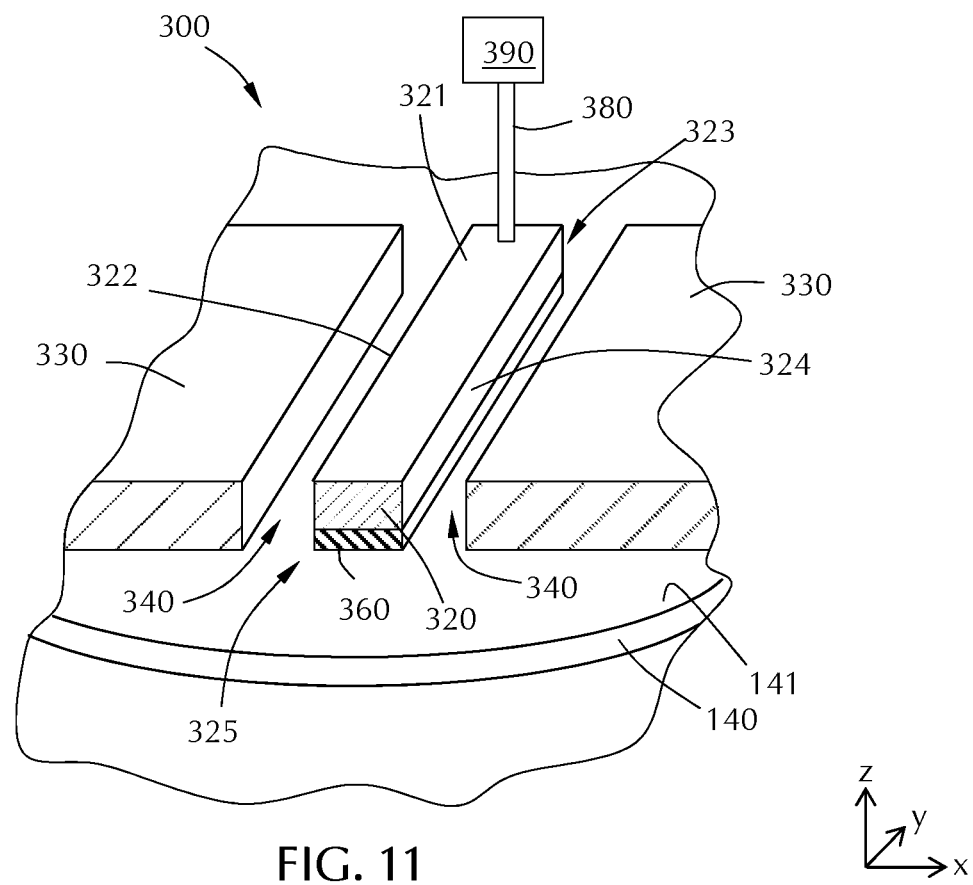
FIG. 11 shows a partial isometric view of a processing chamber with plasma source assembly in accordance with one or more embodiments of the disclosure.

Referring to FIGS. 1, 2, 8 and 11, some embodiments of the disclosure are directed to processing chambers 100 including a susceptor assembly 140 and a gas distribution assembly 120. FIG. 11 shows an isometric view of a processing chamber 100 in accordance with one or more embodiments of the disclosure. The susceptor assembly 140 has a top surface 141 to support and rotate a plurality of substrates 60 around a central axis 161.

The gas distribution assembly 120 has a front surface 121 facing the top surface 141 of the susceptor assembly 140 to direct a flow of gases toward the top surface 141 of the susceptor assembly 140. The gas distribution assembly 120 of some embodiments includes a plasma source assembly 300 with a wedge-shaped housing 310. The wedge-shaped housing has an inner peripheral edge 123 and an outer peripheral edge 124 defining a major axis 308 of the housing 310. The housing 310 has a first side 371, a second side 372, a gas inlet 315 and a front face 312. A flow path is defined as the path followed by a gas flowing from the gas inlet 315 through the housing 310 and exiting from the front face 312.

Figure 15:
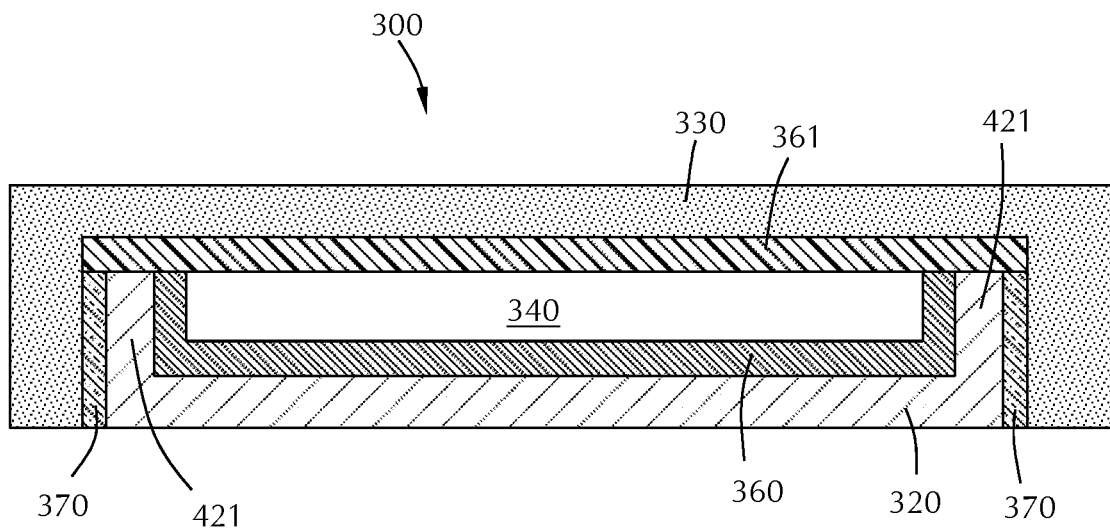
FIG. 15 shows a bottom schematic view of a plasma source assembly with RF hot electrode with a leg in accordance with one or more embodiment of the disclosure.

The plasma source assembly 300 has at least one RF hot electrode 320 with a first surface 322 oriented substantially parallel to the flow path. In the embodiment shown, there are three RF hot electrodes 320. At least one return electrode 330 is within the housing 310 and has a first surface 332 oriented parallel to the flow path and spaced from the first surface 322 of the RF hot electrode 320 to form a gap 340. The front face 312 of the wedge-shaped housing 310 of the plasma source assembly 300 is positioned a distance from the top surface 141 of the susceptor assembly 140 in the range of about 1 mm to about 5 mm, or in the range of about 1.5 mm to about 4 mm, or about 2 mm. The embodiment shown in FIG. 15 is merely exemplary of one possible configuration of a processing chamber with a plasma source assembly and should not be taken as limiting the scope of the disclosure.

Referring back to FIG. 6, some embodiments include a coaxial RF feed line 380 that passes through the housing 310 and provides power for the RF hot electrode 320 to generate the plasma in the gap 340. The coaxial RF feed line 380 includes an outer conductor 382 and an inner conductor 384 separated by an insulator 386. The inner conductor 384 is in electrical communication with the RF hot electrode 320 and outer conductor 382 is in electrical communication with electrical ground or a different phase power source (not shown) than the RF hot electrode. As used in this specification and the appended claims, the term "electrical communication" means that the components are connected either directly or through an intermediate component so that there is little electrical resistance. The gap between inner conductor 384 and outer conductor 382 can be filled with a dielectric, which may be ceramic, but can be any suitable dielectric material.

The coaxial RF feed line 380 may be constructed so that the outer conductor 382 terminates on the return electrode 330. The inner conductor 384 can terminate on the RF hot electrode 320. In some embodiments, the gas inlet 315 is fed to the housing around the outside periphery of the coaxial feed. The RF feed may be in the form of a coaxial transmission line. The outer conductor can be connected/terminated in the return electrode, and the inner conductor is connected to the RF hot electrode. The return electrode 330 can be connected to the metal housing by any suitable method including, but not limited to, a metal gasket. This helps to ensure a symmetric geometry of the return currents. All return currents flow up the outer conductor of the feed, minimizing RF noise. In some embodiments, the RF feed is designed to provide symmetric RF feed current to the RF hot electrode, and symmetric return currents. All return currents flow up the outer conductor, minimizing RF noise, and minimizing impact of source installation on operation.

For a linear radial plasma source, like that shown in FIGS. 6-8, in any processing system that uses a rotating susceptor (platen), the plasma exposure (treatment) is greater at the inner diameter (ID) of the wafer compared to the outer diameter (OD) of the wafer. In a system with a coaxial feed connected to the approximate center of the hot electrode, the difference between the ID and OD exposure can be about 2.7 times. Currently, the coaxial feed is connected to the hot electrode at about the center of the electrode. This connection configuration may not provide uniform plasma exposure at the ID and OD of the wafer. One or more embodiments of the disclosure advantageously provide simple linear design plasma source. Some embodiments advantageously provide an inner diameter feed at high frequency or very high frequency with increasing plasma flux from the wafer ID to OD.

Figure 12:
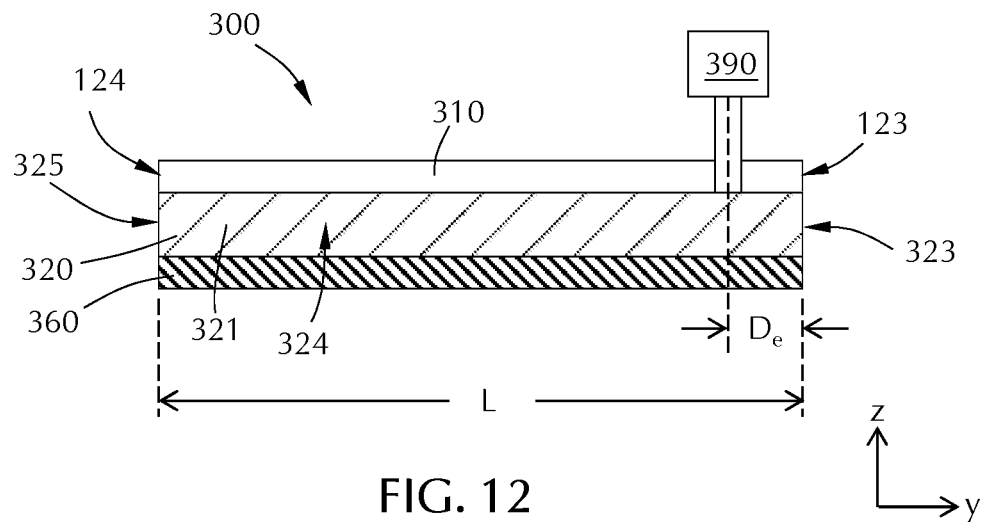
FIG. 12 shows a partial cross-sectional side schematic of a plasma source assembly electrodes in accordance with one or more embodiments of the disclosure.

Referring to FIGS. 11 and 12, the vertical plasma source (VPS) can be a linear plasma source with a powered electrode (hot electrode) and return electrode that extend from the ID to OD of the wafer and beyond. The gap between the hot electrode and return electrode can be substantially uniform along the length of the electrodes from the ID to OD.

The electrodes of some embodiments are enclosed by inner and outer cladding made from a dielectric material to minimize metal contamination. The "inner cladding" can be used to refer to the cladding associated with the RF hot electrode and the "outer cladding" can be used to refer to the cladding associated with the return electrode. A gap is maintained between the bottom of the cladding and the wafer/susceptor that exposes plasma to the wafer.

Generally, the electric field (and plasma flux) generated in a plasma assembly is greatest near the RF feed with field strength decreasing with distance from the RF feed. In the linear vertical plasma source, the minimum electric field and plasma density occurs surprisingly underneath the RF feed. Without being bound by any particular theory of operation, it is believed that this is due to electromagnetic effects which increase with the frequency of the RF power. The inventors have found that moving the RF feed toward the ID end of the hot electrode can compensate for the exposure non-uniformity.

The power source 390 can be operated at any suitable frequency. It has been found that higher frequency power may create a plasma density variation that can compensate for the differing exposure between the ID and OD due to susceptor rotation. In some embodiments, the power source 390 is operated at high frequency (20-30 MHz) or at very high frequency (30-100 MHz). In some embodiments, the power source 390 is operated at 60 MHz.

Figure 13:
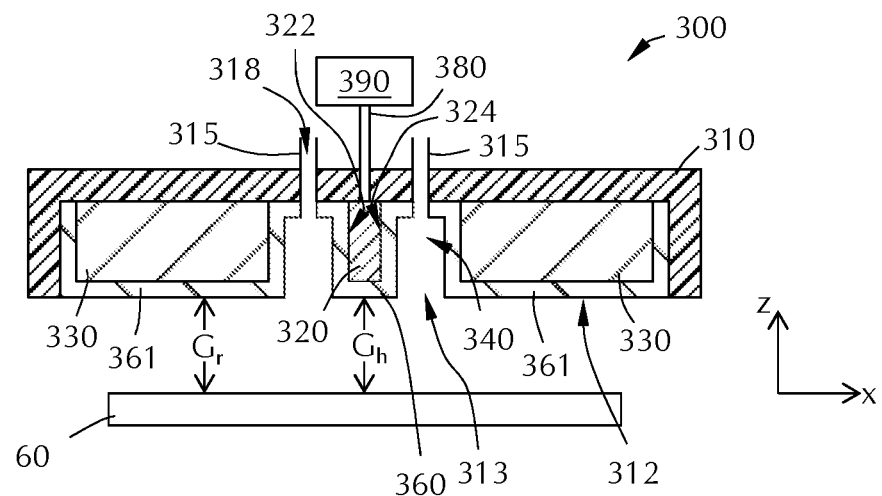
FIG. 13 shows a partial cross-sectional view of a plasma source assembly in accordance with one or more embodiments of the disclosure.

Referring to FIGS. 11 through 13, one or more embodiments of the disclosure is directed to a plasma source assembly 300. The plasma source assembly 300 includes a housing 310, shown in FIG. 13. The housing 310 of some embodiments holds or supports all of the components of the plasma source assembly except the power connection or gas line connections that might be used. Combined into one housing, the plasma source assembly can be modular; allowing the assembly to be moved, added to or removed from a processing apparatus. The housing 310 of some embodiments is wedge-shaped to fit into a gas distribution assembly 120 like that shown in FIG. 4 or 5. While the housing 310 may be wedge-shaped, the shape of the plasma cavity or gap in which the plasma is formed, can be linear. The embodiment illustrated in FIG. 11 does not show the housing for descriptive purposes.

FIG. 12 shows a partial cross-sectional side view of the plasma source assembly 300 of some embodiments. The housing 310 has an inner peripheral edge 123 and an outer peripheral end 124 that can be aligned with the gas distribution assembly 120 illustrated in FIGS. 4 and 5. As shown in FIG. 13, the housing 310 may include a gas inlet 315 to form a flow path 318 from the gas inlet 315 to allow a flow of gas to pass through the housing 310 and out an opening 313 in the front face 312 of the plasma source assembly 300. The front face 312 can be formed by the housing 310, the RF hot electrode 320, the return electrode 330, or any suitable material that can be positioned a distance from the susceptor assembly. In some embodiments, the front face 312 is formed from a combination of separate components resulting in a mixture of materials.

The plasma source assembly includes an RF hot electrode 320 with an elongate body 321 that includes a first surface 322 and a second surface 324 opposite the first surface 322. The first surface 322 and second surface 324 define the width of the RF hot electrode 320. In some embodiments, the first surface 322 and second surface 324 are substantially parallel. As used in this regard, the term substantially parallel means that the surfaces form major planes that are within ±10°, ±9°, ±8°, ±7°, ±6°, ±5°, ±4°, ±3°, ±2° or ±1° of being parallel. In some embodiments, the width of the RF hot electrode 320 is in the range of about 2 mm to about 20 mm, or in the range of about 3 mm to about 15 mm, or in the range of about 4 mm to about 10 mm, or in the range of about 5 mm to about 9 mm, or in the range of about 6 mm to about 8 mm, or about 7 mm.

The elongate body 321 of the RF hot electrode 320 has an inner peripheral end 323 and an outer peripheral end 325. The inner peripheral end 323 of the RF hot electrode 320 is positioned within the housing 310 near the inner peripheral edge 123 of the housing 310. The outer peripheral edge 325 of the RF hot electrode 320 is positioned within the housing 310 near the outer peripheral edge 124 of the housing 310. The inner peripheral end 323 and outer peripheral end 325 define a length L of the RF hot electrode 320. The embodiment illustrated in FIG. 12 shows the housing 310 having about the same length as the RF hot electrode 320. This is merely representative of one possible configuration and should not be taken as limiting the scope of the disclosure. The housing of some embodiments extends beyond the ends of the RF hot electrode and may wrap around at least some of the RF hot electrode. The length L of the RF hot electrode 320 of some embodiments is in the range of about 160 mm to about 440 mm. The length L of the RF hot electrode 320 can be configured to span the width of a substrate to be processed. For example, if the substrates being processed are 200 mm diameter wafers, the RF hot electrode can have a length L in the range of about 160 mm to about 440 mm, or in the range of about 180 mm to about 220 mm, or in the range of about 190 mm to about 210 mm, or in the range of about 195 mm to about 205 mm. If the substrates being processed are 300 mm diameter wafers, the RF hot electrode can have a length L in the range of about 160 mm to about 440 mm, or in the range of about 260 mm to about 440 mm, or in the range of about 280 mm to about 320 mm, or in the range of about 290 mm to about 310 mm, or in the range of about 295 mm to about 305 mm.

A return electrode 330 can be any component that is suitable to allow a return current to flow or provide an opposite polarity voltage from the RF hot electrode. The term "return electrode" is used to represent an electrical connection that forms a complete circuit with the RF hot electrode and should not be taken as implying a direction for a flow of current or electrons. The return electrode 330 of some embodiments is the housing 310. In some embodiments, the return electrode 330 is a separate component within the housing 310. The return electrode 330 can be made from the same material as the housing 310 but be electrically isolated from the housing 310, or the return electrode 330 can be made from a different material than the housing 310. In the embodiments illustrated, the return electrode 330 is a different material than the housing 310. The return electrode 330 of some embodiments has an elongate body that extends from the inner peripheral edge to the outer peripheral edge of the housing. The return electrode is spaced from the RF hot electrode 320 to provide a gap 340 in which a plasma can form.

An RF feed 380 connects a power source 390 to the RF hot electrode 320. The RF feed 380 can be a coaxial RF feed line, like that shown in FIG. 6. As illustrated in FIG. 12, the RF feed 380 connects to the RF hot electrode at a distance $D_e$ from the inner peripheral edge 323 of the RF hot electrode 320. The distance $D_e$ of some embodiments is less than or equal to about 25% of the length L of the RF hot electrode 320. In some embodiments, the distance $D_e$ is less than or equal to about 20%, 15%, 10%, 5%, 4%, 3%, 2% or 1% of the length L of the RF hot electrode 320.

As illustrated in FIG. 13, in some embodiments the RF hot electrode 320 has RF hot electrode cladding 360 positioned so that the RF hot electrode 320 is not exposed directly to the substrate or susceptor assembly. As used in this manner, the term "not exposed directly" and the like means that an atom ejected from the RF hot electrode 320 cannot travel a straight path to impact the surface of the substrate. In the embodiment shown, the RF hot electrode cladding 360 wraps around all exposed sides and surfaces of the RF hot electrode 320. The RF hot electrode cladding 360 of some embodiments comprises one or more of silicon or silicon oxide. In some embodiments, the RF hot electrode cladding 360 comprises or consists essentially of quartz. In some embodiments, the RF hot electrode cladding 360 is made from a material that is not sputtered as a contaminant on a wafer being processed. The RF hot electrode cladding 360 materials may depend on the process or deposition being performed.

In some embodiments, the return electrode 330 includes a return electrode cladding 361. The return electrode cladding 361 of some embodiments is positioned so that the return electrode 330 is not directly exposed to the substrate or susceptor surface. In some embodiments, the return electrode cladding 361 comprises one or more of silicon, silicon oxide or aluminum oxide.

The return electrode cladding 361 of some embodiments comprises a material that is different from the RF hot electrode cladding 360. In some embodiments, the RF hot electrode cladding 360 and the return electrode cladding 361 are made from the same material. In some embodiments, the RF hot electrode cladding 360 comprises quartz and the return electrode cladding comprises aluminum oxide. In some embodiments, the RF hot electrode cladding 360 consists essentially of quartz and/or the return electrode cladding consists essentially of aluminum oxide. As used in this manner, the term "consists essentially of" means that the composition of the subject cladding is greater than or equal to about 95%, 98% or 99% of the stated material on a weight basis.

The RF hot electrode cladding 360 and return electrode cladding 361 can form the front face 312 of the plasma source assembly 300. The distance $G_h$ from the RF hot electrode cladding 360 to the substrate 60 can be the same as or different from the distance $G_r$ from the return electrode cladding 361 to the substrate 60.

The plasma source assembly 300 of some embodiments provides a plasma with an ion flux generated at the inner peripheral end 323 of the RF hot electrode 320 that is less than an ion flux generated at the outer peripheral end 325 of the RF hot electrode 320.

Additional embodiments of the disclosure are directed to methods of processing a substrate. A substrate 60 is positioned on a susceptor assembly 140 adjacent a gas distribution assembly 120. The gas distribution assembly 120 includes a plasma source assembly in accordance with one or more embodiments of the disclosure. A gas is flowed through the gas inlet 315 of the housing 310 into the gap 340 between the RF hot electrode 320 and the return electrode 330. The RF hot electrode 320 is energized through the RF feed 380 positioned within 25% of the length L of the RF hot electrode 320 measured from the inner peripheral end 323 to form a plasma in the gap 340. The plasma flows out the front face 312 of the housing 310 to expose the substrate 60 to the plasma.

Moving the RF feed toward the inner diameter provides an increase in the plasma flux from the ID toward the OD. However, it has been found that there is a roll off (lower ion flux) in the last 25-30 mm of wafer OD that may adversely impact process performance. Accordingly, one or more embodiments of the disclosure advantageously provide apparatus and methods to increase the plasma flux uniformity.

Figure 14A:
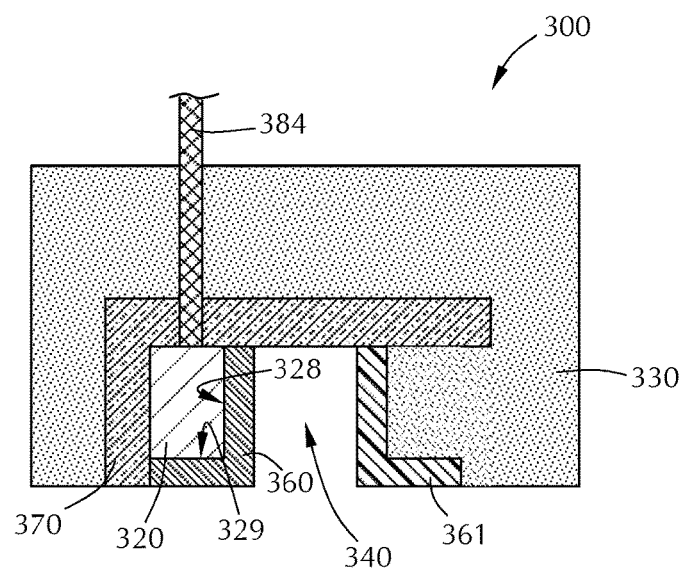
FIG. 14A shows a cross-sectional view of a plasma source assembly in accordance with one or more embodiments of the disclosure.
Figure 14B:
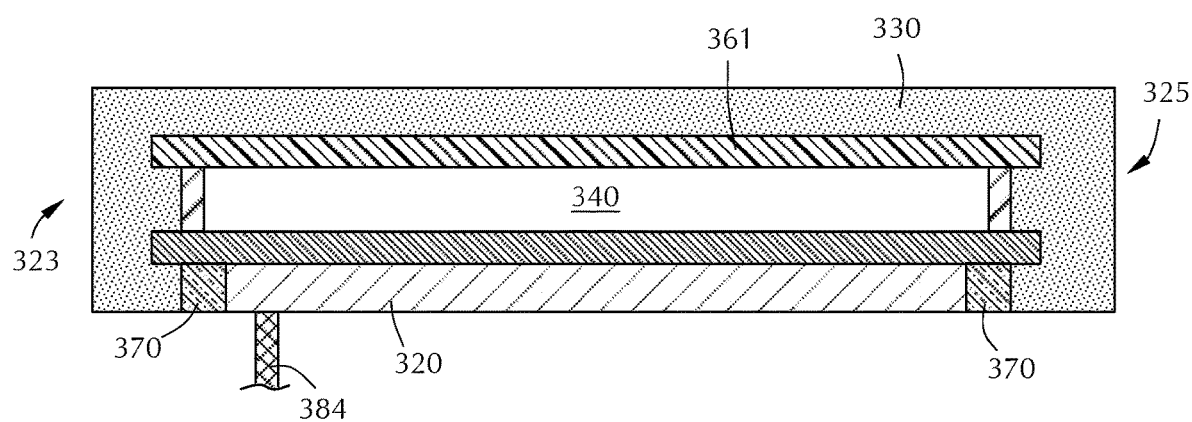
FIG. 14B shows a cross-sectional side view of a plasma source assembly in accordance with one or more embodiment of the disclosure.

FIGS. 14A and 14B show a cross-sectional view and a bottom view, respectively, of a plasma source assembly 300 in accordance with one or more embodiment of the disclosure. The plasma source assembly 300 includes an RF hot electrode 320 and a return electrode 330. In the illustrated embodiment, the return electrode 330 is the housing of the plasma source assembly 300. The RF hot electrode is isolated from the return electrode 330 by a dielectric 370. The inner conductor 384 of the coaxial feed line connects to the RF hot electrode 320 near the inner diameter end 323, relative to the outer diameter end 325.

In the illustrated embodiment, a cladding 360 is wrapped around the lower edge 329 and side edge 328 of the RF hot electrode 320. Along the length of the RF hot electrode 320, from the inner diameter end 323 to the outer diameter end 325, the cladding 360 shields the RF hot electrode 320 from adjacent components so that there is no direct line of sight between the RF hot electrode 320 and other components.

An outer cladding 361 is positioned on the return electrode 330 so that the outer cladding 361 is between the return electrode 330 and the gap 340. As shown, the outer cladding 361 can wrap around a front portion of the return electrode 330 to prevent sputtering of the return electrode.

It has been observed that a low electric field appears near the ID and a high electric field near the OD. The electric field saturates near the OD. As a result of the power distribution for a power connection near the ID, plasma density and ion flux do not increase linearly. In addition, the power is distributed over a larger volume leading to lower plasma density and ion flux near wafer OD. This can lead to edge roll off that adversely affects process performance. Accordingly, some embodiments of the disclosure advantageously provide apparatus to enhance the power distribution to the electrodes near the OD by using a shaped RF hot electrode.

FIG. 15 illustrates a bottom view of an embodiment of a plasma source assembly 300 with a U-shaped RF hot electrode 330. The increase in power distribution uniformity enhances the plasma density and the ion flux to the wafer near the OD increases and becomes more uniform from ID to OD. In FIG. 15, the RF hot electrode 320 has legs 421 that extend at an angle to the main portion of the RF hot electrode 320 toward the outer cladding 361. In the embodiment shown, the legs 421 of the RF hot electrode 320 contact the outer cladding 361. In some embodiments, there is a space or different material separating the leg 421 from the outer cladding 361. The cladding 360 follows the shape of the RF hot electrode 320 so that the legs 421 are shielded from line-of-sight to the gap 340 to prevent sputtering of the RF hot electrode 320. The legs 421 at the ID and OD are shown as having the same length and width. However, the skilled artisan will recognize that the length of the leg 421 at the ID can be different than the length of the leg 421 at the OD.

In some embodiments, the cladding 360 or outer cladding 361 comprises quartz. The thickness of the cladding 360 or outer cladding 361 can be in the range of about 0.25 mm to about 2.5 mm, or in the range of about 0.5 mm to about 2.0 mm, or in the range of about 0.75 mm to about 1.5 mm.

Figure 16:
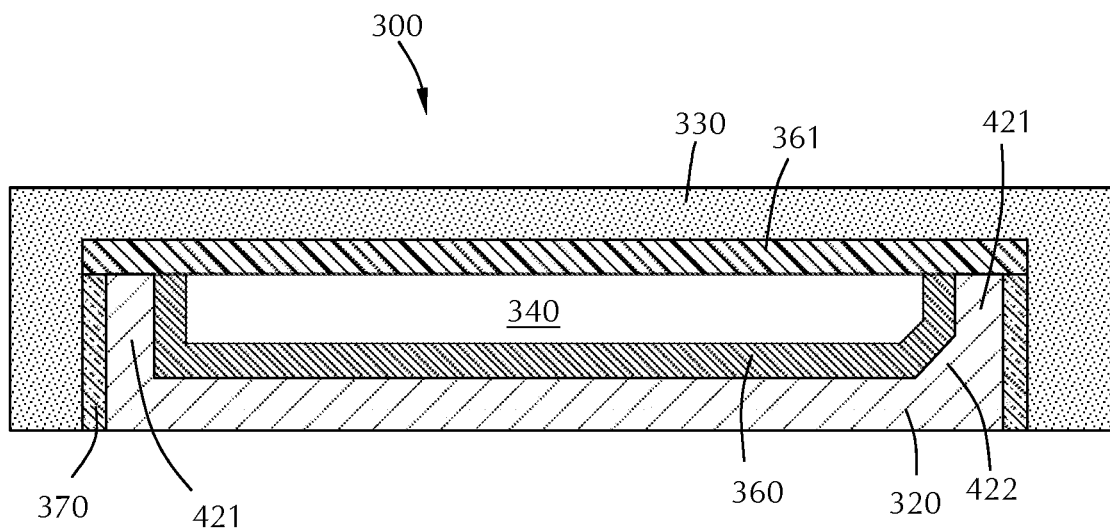
FIG. 16 shows a bottom schematic view of a plasma source assembly with RF hot electrode with leg and triangular portion in accordance with one or more embodiment of the disclosure.

The embodiment illustrated in FIG. 16 includes a triangular portion 422 near the leg 421 of the RF hot electrode 320. The triangular portion 422 is at the OD end of the RF hot electrode 320. However, a triangular portion can also be on the ID end of the electrode. The cladding 360 near the triangular portion 422 can be the same thickness as the cladding near the leg 421 or near the middle of the electrode. In some embodiments, the cladding 360 near the triangular portion 422 is thinner than the cladding near the middle of the electrode near the leg 421. While the embodiment illustrated shows triangular portion 422 as being angled at about 45 degrees relative to the main portion of the electrode, it will be understood that the angle can be different. Additionally, it will be understood that the triangular portion can be non-linear. For example, the triangular portion 422 can have a curved appearance that connects the main portion of the electrode to the leg.

In some embodiments, the power distribution profile may be improved by increasing the RF coupling between the powered electrode (RF hot electrode 320) and ground (return electrode 330) where deposition is low. In some embodiments, the power distribution profile can be improved by decreasing the RF coupling between the powered electrode and ground where deposition is high. The RF coupling can be modulated by different techniques including, but not limited to, changing the spacing between the RF hot electrode 320 and the cladding 360, changing the spacing between the return electrode 330 and the outer cladding 361, changing the thickness of the cladding 360 and/or changing the thickness of the outer cladding 361.

Figure 17A:
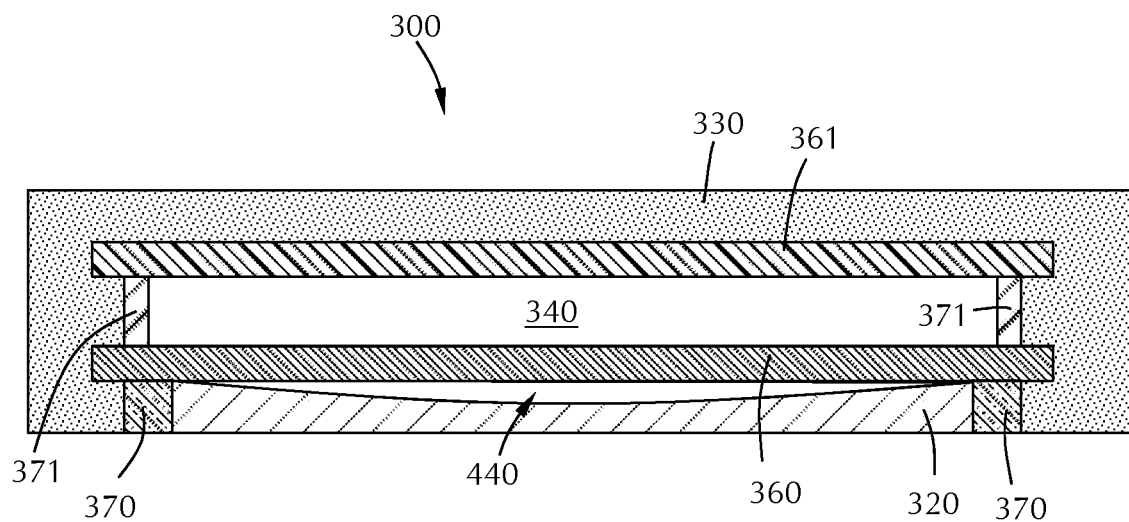
FIGS. 17A and 17B show bottom schematic views of plasma source assemblies with gaps between electrodes and cladding in accordance with one or more embodiments of the disclosure.
Figure 17B:
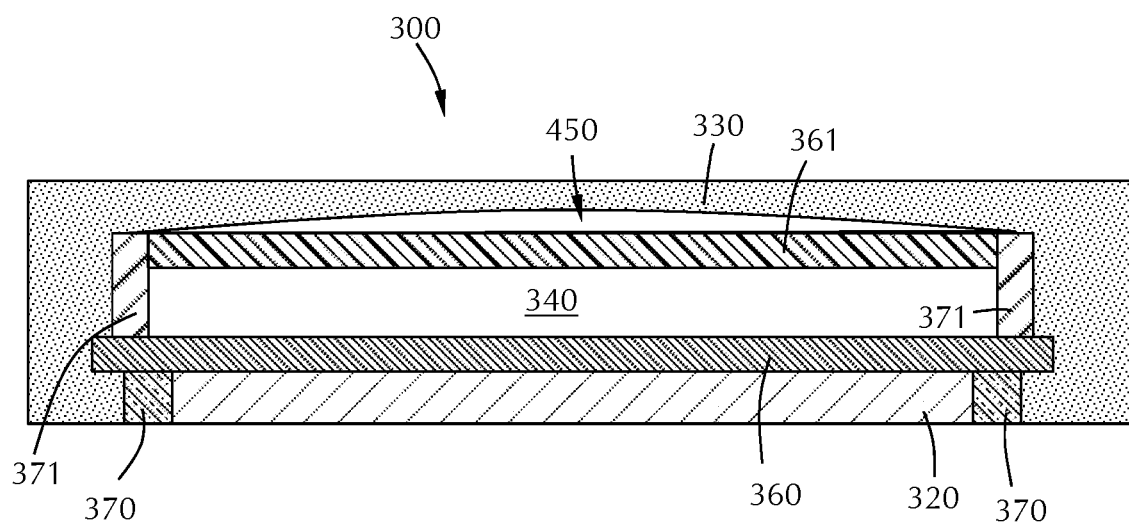

FIGS. 17A and 17B illustrate embodiments in which the spacing between the cladding 360 or outer cladding 361 from the RF hot electrode 320 or return electrode 330, respectively, are varied. In FIG. 17A, a gap 440 between the RF hot electrode 320 and the cladding 360 is varied. In the embodiment illustrated, the gap 440 is largest in the middle of the length of the RF hot electrode 330 with the gap 440 tapering or narrowing to disappearing near the ID and OD of the electrode. In some embodiments, the gap 440 is not symmetrical across the length of the electrode from ID to OD. Increasing the size of the gap 440 can modulate or change the effective dielectric constant of cladding 360.

In FIG. 17B, a gap 450 between the return electrode 330 and the outer cladding 361 is varied. In the illustrated embodiment, the gap 450 is largest in the middle of the length of the gap 340 with the gap 450 tapering or narrowing to disappearing near the ID and OD of the gap 340. In some embodiments, the gap 450 is not symmetrical across the length of the gap 340. The gap 440 is measured relative to the gap 340 because the return electrode 330 can be very large and non-symmetrical with respect to the gap 340 and the RF hot electrode 320.

The gap 440 or gap 450 can be any suitable shape and size. In some embodiments, the gap 440 or gap 450 is less than or equal to about 0.75 mm at the widest point along the length of the gap 340. In some embodiments, the gap 440 or gap 450 is less than or equal to about 0.9 mm, 0.8 mm, 0.7 mm, 0.6 mm or 0.5 mm. If the gap 440 or gap 450 is too large, a plasma could form in the gap 440 or gap 450.

Figure 18A:
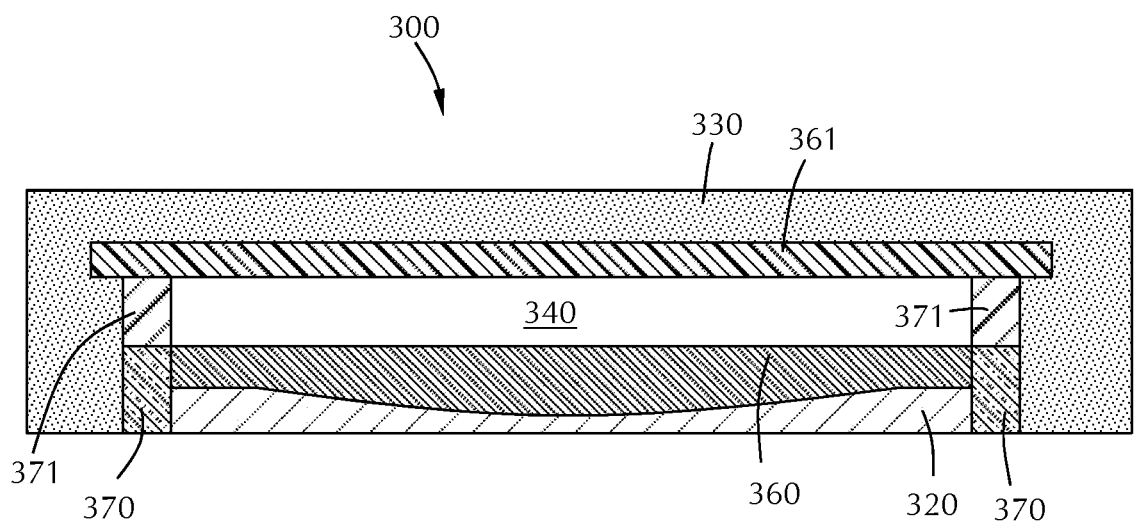
FIGS. 18A and 18B show bottoms schematic views of plasma source assemblies with variable dimension claddings in accordance with one or more embodiment of the disclosure.
Figure 18B:
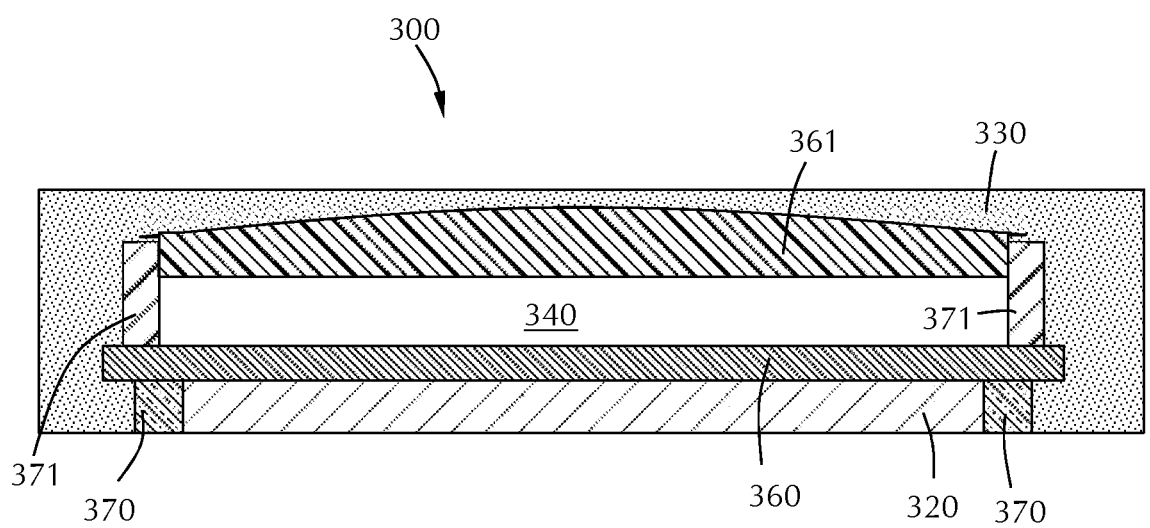

FIGS. 18A and 18B illustrate embodiments of the disclosure in which the thickness of the cladding 360 or outer cladding 361 are changed or variable along the length of the gap 340. In FIG. 18A, the cladding 360 is thicker near the middle of the gap 340. The thickness of the RF hot electrode 320 near the middle of the gap 340 is shown as being thinner. However, the skilled artisan will recognize that the thickness of the RF hot electrode 320 can remain uniform across the length of the gap 340 while the thickness of the cladding 360 changes. In FIG. 18B, the outer cladding 361 is thicker near the middle of the gap 340.

Figure 19A:
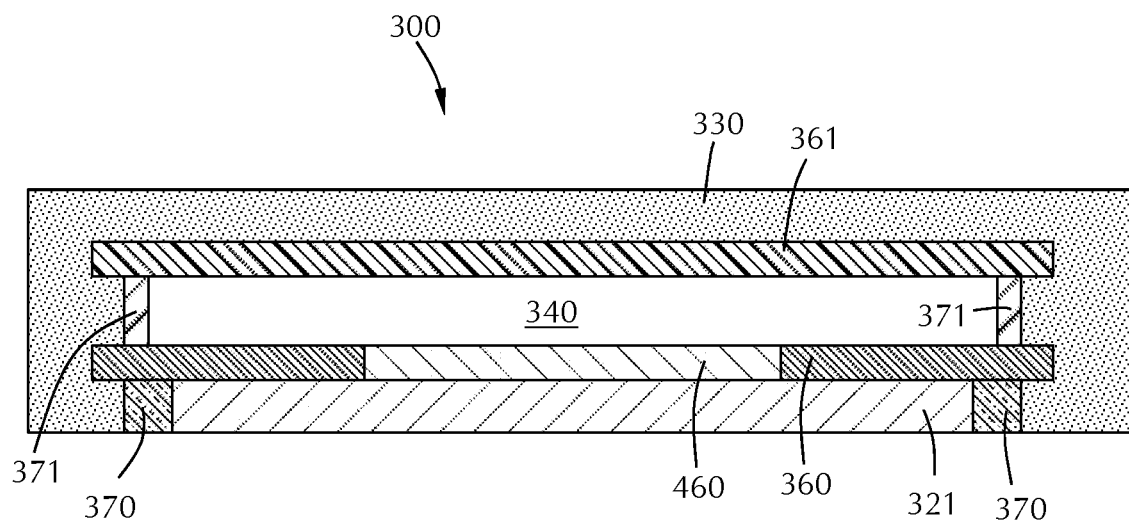
FIGS. 19A and 19B show bottom schematic views of plasma source assemblies with claddings with varying properties in accordance with one or more embodiment of the disclosure.
Figure 19B:
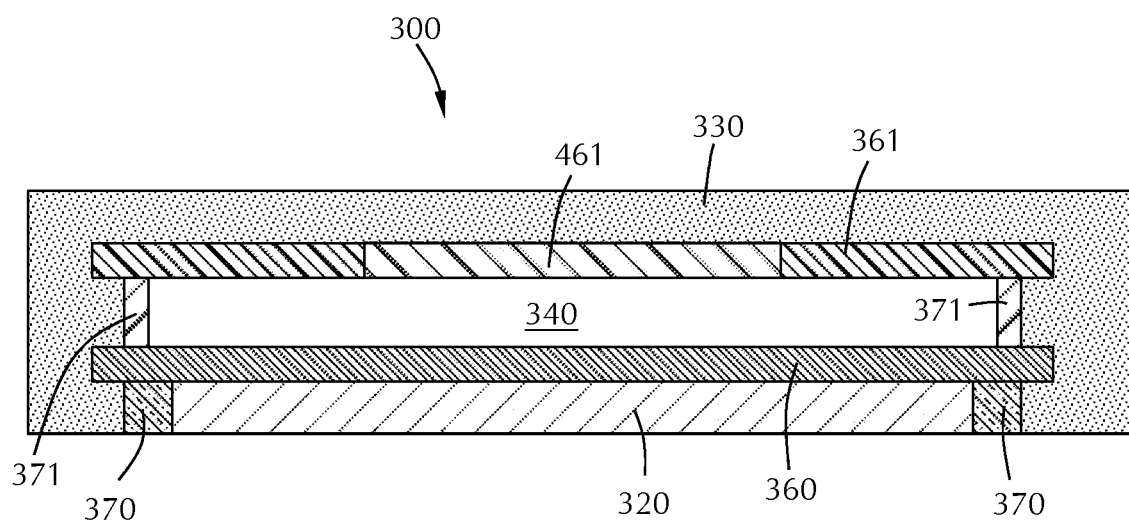

FIGS. 19A and 19B illustrate embodiments of the disclosure in which the dielectric constant of the cladding 360 or outer cladding 361 are changed or variable along the length of the gap 340. The dielectric constant can be changed or modulated by changing the material composition across the length of the cladding or by changing some property (e.g., density) of the material across the length of the cladding. In FIG. 19A, the cladding 360 has a different cladding 460 in the middle region of the gap 340. In FIG. 19B, the outer cladding 361 has a different outer cladding 461 in the middle region of the gap 340. The embodiments shown have two materials; however the skilled artisan will recognize that there can be a dynamic change in the properties of the cladding 360 or outer cladding 361 across the length of the gap 340.

The embodiments illustrated change the material properties (e.g., dielectric constant, spacing or width) at the middle of the gap 340. However, it will be recognized that this is merely exemplary of one possible configuration and the location of the modulations can vary.

Additional embodiments of the disclosure are directed to methods of processing a plurality of substrates. The plurality of substrates is loaded onto substrate support in a processing chamber. The substrate support is rotated to pass each of the plurality of substrates across a gas distribution assembly to deposit a film on the substrate. The substrate support is rotated to move the substrates to a plasma region adjacent a capacitively coupled plasma source generating substantially uniform plasma in the plasma region. This is repeated until a film of predetermined thickness is formed.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

The frequency of the plasma may be tuned depending on the specific reactive species being used. Suitable frequencies include, but are not limited to, 400 kHz, 2 MHz, 13.56 MHz, 27 MHz, 40 MHz, 60 MHz and 100 MHz.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A plasma source assembly comprising:
   a housing having an inner peripheral edge, an outer peripheral edge and a front face, the housing including a gas inlet to form a flow path from the gas inlet to allow a flow of gas to pass through the housing and out an opening in the front face;
   an RF hot electrode within the housing, the RF hot electrode having an elongate body with an inner peripheral end adjacent the inner peripheral edge of the housing and an outer peripheral end adjacent the outer peripheral edge of the housing and defining a length of the RF hot electrode, the RF hot electrode including a leg extending at an angle to the elongate body;
   a return electrode having an elongate body extending between the inner peripheral edge and the outer peripheral edge of the housing, the return electrode spaced from the RF hot electrode to provide a gap in which a plasma can form;

an RF feed connected to the RF hot electrode at a distance from the inner peripheral end of the RF hot electrode that is less or equal to 25% of the length of the RF hot electrode;

a RF hot electrode cladding positioned so that the RF hot electrode is not exposed; and a return electrode cladding positioned so that the return electrode is not exposed, wherein the RF hot electrode cladding has a dielectric constant that changes along the length of the gap between the RF hot electrode and the return electrode.

2. The plasma source assembly of claim 1, wherein the return electrode is the housing.

3. The plasma source assembly of claim 1, wherein the RF feed is connected to the RF hot electrode at a distance from the inner peripheral end of the RF hot electrode that is less than or equal to 5% of the length of the RF hot electrode.

4. The plasma source assembly of claim 1, wherein the RF hot electrode includes a triangular portion adjacent the leg and the elongate body of the electrode, the triangular portion extending into the gap.

5. The plasma source assembly of claim 1, wherein there is one or more of a RF hot electrode gap between the RF hot electrode and the RF hot electrode cladding, the RF hot electrode gap having a dimension that changes along the length of the gap between the RF hot electrode and the return electrode, or a return electrode gap between the return electrode and the return electrode cladding, the return electrode gap having a dimension that changes along the length of the gap between the RF hot electrode and the return electrode.

6. The plasma source assembly of claim 1, wherein the return electrode cladding has a dielectric constant that changes along the length of the gap between the RF hot electrode and the return electrode.

7. A plasma source assembly comprising:
a housing having an inner peripheral edge, an outer peripheral edge and a front face, the housing including a gas inlet to form a flow path from the gas inlet to allow a flow of gas to pass through the housing and out an opening in the front face;

an RF hot electrode within the housing, the RF hot electrode having an elongate body with an inner peripheral end adjacent the inner peripheral edge of the housing and an outer peripheral end adjacent the outer peripheral edge of the housing and defining a length of the RF hot electrode, the RF hot electrode including a leg extending at an angle to the elongate body;

a return electrode having an elongate body extending between the inner peripheral edge and the outer peripheral edge of the housing, the return electrode spaced from the RF hot electrode to provide a gap in which a plasma can form;

an RF feed connected to the RF hot electrode at a distance from the inner peripheral end of the RF hot electrode that is less or equal to 25% of the length of the RF hot electrode;

a RF hot electrode cladding positioned so that the RF hot electrode is not exposed; and a return electrode cladding positioned so that the return electrode is not exposed, wherein the return electrode cladding has a dielectric constant that changes along the length of the gap between the RF hot electrode and the return electrode.

8. The plasma source assembly of claim 7, wherein the return electrode is the housing.

9. The plasma source assembly of claim 7, wherein the RF feed is connected to the RF hot electrode at a distance from the inner peripheral end of the RF hot electrode that is less than or equal to 5% of the length of the RF hot electrode.

10. The plasma source assembly of claim 7, wherein the RF hot electrode includes a triangular portion adjacent the leg and the elongate body of the electrode, the triangular portion extending into the gap.

11. The plasma source assembly of claim 7, wherein there is one or more of a RF hot electrode gap between the RF hot electrode and the RF hot electrode cladding, the RF hot electrode gap having a dimension that changes along the length of the gap between the RF hot electrode and the return electrode, or a return electrode gap between the return electrode and the return electrode cladding, the return electrode gap having a dimension that changes along the length of the gap between the RF hot electrode and the return electrode.

12. The plasma source assembly of claim 7, wherein the RF hot electrode cladding has a dielectric constant that changes along the length of the gap between the RF hot electrode and the return electrode.

13. A plasma source assembly comprising:
a housing having an inner peripheral edge, an outer peripheral edge and a front face, the housing including a gas inlet to form a flow path from the gas inlet to allow a flow of gas to pass through the housing and out an opening in the front face;

an RF hot electrode within the housing, the RF hot electrode having an elongate body with an inner peripheral end adjacent the inner peripheral edge of the housing and an outer peripheral end adjacent the outer peripheral edge of the housing and defining a length of the RF hot electrode, the RF hot electrode including a leg extending at an angle to the elongate body;

a return electrode having an elongate body extending between the inner peripheral edge and the outer peripheral edge of the housing, the return electrode spaced from the RF hot electrode to provide a gap in which a plasma can form;

an RF feed connected to the RF hot electrode at a distance from the inner peripheral end of the RF hot electrode that is less or equal to 25% of the length of the RF hot electrode;

a RF hot electrode cladding positioned so that the RF hot electrode is not exposed; and a return electrode cladding positioned so that the return electrode is not exposed, wherein the RF hot electrode cladding has a dielectric constant that changes along the length of the gap between the RF hot electrode and the return electrode and the return electrode cladding has a dielectric constant that changes along the length of the gap between the RF hot electrode and the return electrode.

14. The plasma source assembly of claim 13, wherein the return electrode is the housing.

15. The plasma source assembly of claim 13, wherein the RF feed is connected to the RF hot electrode at a distance from the inner peripheral end of the RF hot electrode that is less than or equal to 5% of the length of the RF hot electrode.

16. The plasma source assembly of claim 13, wherein the RF hot electrode includes a triangular portion adjacent the leg and the elongate body of the electrode, the triangular portion extending into the gap.

17. The plasma source assembly of claim 13, wherein there is one or more of a RF hot electrode gap between the RF hot electrode and the RF hot electrode cladding, the RF hot electrode gap having a dimension that changes along the length of the gap between the RF hot electrode and the return electrode, or a return electrode gap between the return electrode and the return electrode cladding, the return electrode gap having a dimension that changes along the length of the gap between the RF hot electrode and the return electrode.

* * * * *